(12) United States Patent
Cannon et al.

(10) Patent No.: US 6,198,629 B1
(45) Date of Patent: Mar. 6, 2001

(54) CIRCUIT BOARD AND COMPUTER SYSTEM FOR ENHANCED COOLING

(75) Inventors: Lonnie J. Cannon, Austin; Steven Michael Christensen, Leander; Howard Victor Mahaney, Jr., Cedar Park; Bruce James Wilkie, Georgetown, all of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/282,628

(22) Filed: Mar. 31, 1999

(51) Int. Cl.$^7$ ........................................................ H05K 7/20
(52) U.S. Cl. ............................................. 361/695; 361/752
(58) Field of Search ................................... 361/687–689, 361/690, 692–695, 719–721, 752; 454/184

(56) References Cited

U.S. PATENT DOCUMENTS

| | | | |
|---|---|---|---|
| 4,399,484 | * 8/1983 | Mayer | 361/689 |
| 4,839,774 | * 6/1989 | Hamburgen | 361/690 |
| 5,218,514 | * 6/1993 | Huynh et al. | 361/695 |
| 5,671,120 | * 9/1997 | Kikinisi | 361/687 |
| 6,027,535 | * 2/2000 | Eberle et al. | 361/690 |

* cited by examiner

Primary Examiner—Gregory Thompson
(74) Attorney, Agent, or Firm—Joseph P. Lally; Leslie A. Van Leeuwen

(57) ABSTRACT

A computer system including a chassis of substantially rectangular cross section suitable for receiving a circuit board. A rear face of the chassis includes upper and lower exhaust ports. A CPU board including one or more processors may be housed within the chassis. The expansion board is suitable for receiving a plurality of expansion cards via connectors attached to the board. The expansion board includes at least one void for facilitating air flow and is housed within the chassis wherein a rear side of the board is proximal to the rear face of the chassis between the upper and lower exhaust ports. An air moving device is positioned within the chassis for directing air flow across the expansion board toward the rear face of the chassis and, via the at least one void in the expansion card, through the upper and lower exhaust ports. Preferably, at least one of the voids comprises a notch formed in the perimeter of the expansion board wherein the interior surface of the chassis together with the notched void cooperatively define a passage for facilitating air flow. In the preferred embodiment, the computer system further includes a plurality of expansion cards that are received by the expansion board via the connectors. The system may further include a sheet metal piece displaced below the expansion board. The sheet metal piece may be vertically displaced below the lower exhaust port of the rear face of the chassis. In another embodiment, the sheet metal piece is displaced above a portion of the lower exhaust port. In this embodiment, the sheet metal piece preferably includes one or more voids or screens corresponding to the voids in the expansion board.

12 Claims, 4 Drawing Sheets

CIRCUIT BOARD AND COMPUTER SYSTEM FOR ENHANCED COOLING

BACKGROUND

1. Field of the Present Invention

The present invention generally relates to the field of computers and more particularly to a circuit board design for enhanced cooling in a computer system.

2. History of Related Art

Computer systems including personal computers, servers systems, and enterprise systems are universally prevalent in a vast assortment of business, scientific, commercial, and home applications. The thermal generation characteristics of the semiconductor technology that drives essentially all computer systems have been well documented and heat dissipation in computer systems has been a design and manufacturing concern from the inception of the industry.

Several emerging trends in computer design have heightened the need for efficiently dissipating heat in computer systems. Among these trends, the desire to increase the number of features packaged within a given system by increasing the number of expansion or I/O cards connected to the system, the desire to decrease the size of the computer system chassis or box, and the ever increasing power dissipated by the emerging generation of I/O cards due to increased functionality and performance, have all resulted in unprecedented levels of thermal generation.

Accommodating more I/O cards without increasing the chassis dimensions results in decreased spacing between adjacent I/O cards. The reduced spacing translates directly into reduced air flow between adjacent cards and hence higher component temperatures. Typically, I/O cards are inserted into an expansion board or planar that either connects to or is an integral part of the computer system's processor board or motherboard. The expansion board includes multiple connectors for attaching I/O cards. Frequently, the problems of adequately dissipating the heat generated by the I/O cards is in part a result of the poor air flow that is characteristic of certain regions of the I/O cards. Typically, the region of the I/O card proximal to the corner formed by the rear face of the chassis and the planar has poor air flow. As the connector pitch in these planars decreases and/or the functionality and performance of the I/O cards increases, the heating problem of providing adequate air circulation to remote portions of I/O cards increases.

Inadequate heat dissipation on computer systems detrimentally affects system performance and reliability. As the temperature of the semiconductor components of the system increase, the speed at which the devices operate decreases. If the temperature increases beyond a specified threshold, the devices may experience temporary or permanent thermal breakdown. Typically, air moving devices (AMD's) such as fans or blowers are introduced into the computer system to increase air flow and to maximize heat dissipation. As board-to-board spacing or pitch continues to decrease, however, the benefit achieved by adding more AMD's or higher speed AMD's into the computer system is reduced. Additionally, it is desirable to minimize the use of AMD's in a computer system because each AMD consumes valuable space that could otherwise be dedicated to system electronics, increases system cost, and undesirably increases the system noise level. Accordingly, it is highly desirable to provide for an enhanced cooling method that addresses the greater challenges presented by densely spaced higher performance I/O cards required in present day systems without significantly increasing system cost and without significantly decreasing system performance or reliability.

SUMMARY OF THE INVENTION

The problems identified above are in large part addressed by a computer system employing a circuit board designed to facilitate air flow in regions of the I/O cards that would otherwise receive little air flow. Broadly speaking, the present invention contemplates a computer system including a chassis, an expansion board, and an AMD. A CPU that includes one or more processors may be housed within the chassis. Preferably, the chassis has a substantially rectangular cross section suitable for receiving the expansion board. A rear face of the chassis includes upper and lower exhaust ports. The expansion board includes an upper and lower surface and is suitable for receiving a plurality of expansion cards via connectors attached to the upper surface. The expansion board may be coupled to a CPU board and is housed within the chassis and positioned such that a rear side of the expansion board abuts or is located proximal to an interior surface of the rear face of the chassis between the upper and lower exhaust ports. The expansion board further includes one or more holes or voids for facilitating air flow. The AMD is positioned within the chassis for directing air flow across the expansion board toward the rear face of the chassis and through the upper and, via the voids in the expansion card, through the lower exhaust ports in the rear face of the chassis.

Preferably, at least one of the voids comprises a notch that is routed or otherwise formed in the perimeter of the expansion board. In this embodiment, the interior surface of the chassis together with the notched void cooperatively define a passage for facilitating air flow at the edge of the expansion board. In the preferred embodiment, the computer system further includes a plurality of expansion or I/O cards that are received by the expansion board via the connectors. The system may further include a sheet metal piece vertically displaced below and substantially parallel to the expansion board. In one such embodiment, the expansion board is connected to the sheet metal piece via spacer structures. The sheet metal piece may, in one embodiment, be vertically displaced below the lower exhaust port of the rear face of the chassis. In another embodiment, the sheet metal piece is displaced above the lower exhaust port. In this embodiment, the sheet metal piece preferably includes one or more vents corresponding to the voids in the expansion board. The sheet metal vents may simply comprise voids in the sheet metal or, in an embodiment suitable for maximizing the EMF shielding provided by the sheet metal piece, the vents may comprise a perforated section or screen. Ideally, the sheet metal vents and the expansion board voids are aligned when the expansion board is received within the chassis. The sheet metal piece may reside between the expansion board and a power supply of the computer system thereby shielding the expansion board and I/O cards above the sheet metal and electronics below the sheet metal from one another.

The present invention still further contemplates a circuit board suitable for being received within a substantially rectangular chassis of a computer system. The circuit board includes at least one void suitable for facilitating air flow when the circuit board is received within the chassis. In one embodiment in which the circuit board comprises an expansion board, the board includes a plurality of connectors suitable for receiving a plurality of I/O cards. In one embodiment, the circuit board connectors are compliant with the PCI or other industry standard local bus specification. In the preferred embodiment, at least one of the voids is a notch formed at the perimeter of the circuit board, wherein, together with an interior surface of the chassis, the notched void defines an air passage at the edge of the circuit board when the board is received within the chassis. In this embodiment, the notched void is preferably defined by a pair of substantially parallel notch sidewalls that extend perpendicularly from the interior surface of the chassis to a baseline of the notch, where the baseline extends substantially parallel to the interior surface of the chassis when the circuit board is received within chassis. In one embodiment, at least one of the notched voids is formed into two or more of the four sides of the circuit board. In another embodiment, the notched voids are included in only the side of the board that abuts the interior surface of the rear face of the chassis when the circuit board is received within the chassis.

The present invention still further contemplates a method of cooling I/O cards in a computer system. Air flow is directed across an expansion board of the computer system to which the I/O cards are connected. The air flows through one or more voids included in the expansion board and from the computer system via exhaust ports that are vertically displaced on either side of the expansion board in a rear face of the computer system chassis. In one embodiment, directing the air flow through the voids comprises directing air flow through passages defined by an interior surface of the chassis together with a plurality of notches formed at the edge of the expansion board. In one embodiment, the method further includes directing the air flow through a plurality of voids in a sheet metal piece to which the expansion board may be attached via spacer structures. In this embodiment, the plurality of voids in the sheet metal piece are preferably aligned with the plurality of voids in the expansion board piece.

BRIEF DESCRIPTION OF THE DRAWINGS

Other objects and advantages of the invention will become apparent upon reading the following detailed description and upon reference to the accompanying drawings in which.

Figure 1:
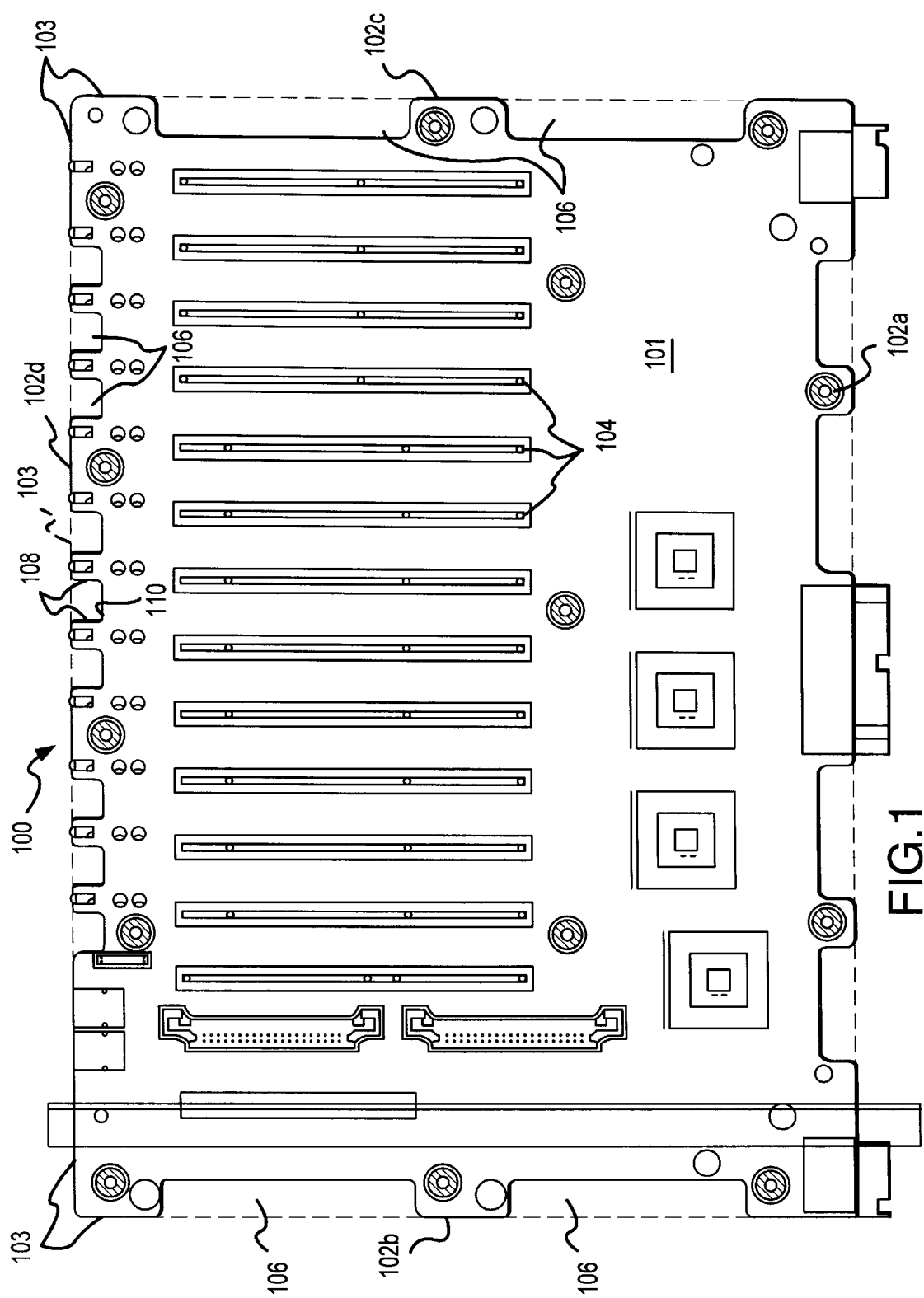
FIG. 1 is a top plan view of a circuit board according to one embodiment of the present invention.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF A PREFERRED EMBODIMENT OF THE PRESENT INVENTION

Turning now to the drawings, FIG. 1 depicts a circuit board 100 according to one embodiment of the present invention. In the depicted embodiment, circuit board 100 is suitably sized and shaped for being received within a substantially rectangular chassis of a computer system (discussed in greater detail below) and includes four major sides identified by reference numerals 102a, 102b, 102c, and 102d. In one embodiment particularly relevant to the heat dissipation benefits achieved by the present invention, circuit board 100 includes a plurality of connectors 104 attached to an upper surface 101 of circuit board 100. Each connector 104 is preferably suited for receiving an I/O card. In this embodiment, circuit board 100 is referred to herein as an expansion board or planar that serves to couple the I/O card signals to the central processing unit or units of the computer system. As its name implies, an I/O card refers to a circuit board designed to extend the I/O capabilities of a computer system and could include, as examples, video and graphics adapters, hard disk controllers, and high speed network adapters. In one embodiment compatible with a wide variety of expansion cards, the pin count, physical dimensions, and spacing of one or more of the connectors 104 comply with Revision 2.2 of the PCI Local Bus Standard published by the PCI Special Interest Group (www.pcisig.com) and incorporated by reference herein. In other embodiments, connectors 104 may comply with any of a number of well known bus architecture specification such as, by way of example, the ISA bus, the EISA bus, or the MCA bus.

Circuit board 100 according to the present invention includes one or more holes, apertures, slots, or notches designed to facilitate air flow and generally referred to herein as voids. As used in this disclosure, a void that is designed to facilitate air flow refers to a void that extends through the thickness of circuit board 100 and that is vacant of any components or hardware when circuit board 100 is received within computer system 200 as depicted and described below. Thus, the air flow facilitating voids referred to herein are distinguished from mounting holes and the like that receive hardware when the circuit board is properly received in the computer system. In the embodiment depicted in FIG. 1, at least one of these voids comprise notches 106 that are routed or otherwise formed into the perimeter line 103 of circuit board 100. In alternative embodiments (not depicted), one or more of the air flow facilitating voids included in circuit board 100 could be formed entirely within the interior of perimeter line 103 such as a drilled or punched hole that receives no hardware or components when circuit board 100 is properly installed or received in the computer system. In the depicted embodiment, each of the notches 106 is defined by a pair of notch sidewalls 108 and a notch baseline 110. Sidewalls 108 extend substantially parallel to one another substantially perpendicular from perimeter line 103 while baseline 110 extends between sidewalls 108 substantially parallel to perimeter line 103. In this configuration, each void 106 may be suitably formed at minimal additional expense with conventional routing techniques during fabrication of circuit board 100. In one embodiment designed to maximize the heat dissipation benefits achieved by the present invention, notches 106 are included in two or more sides 102 of circuit board 100. In addition to the configuration of notches 106 shown in FIG. 1 and those presented below, it will be appreciated that a wide variety of configuration and placement of notches 106 and other air flow facilitating voids is contemplated by the present invention.

Figure 2:
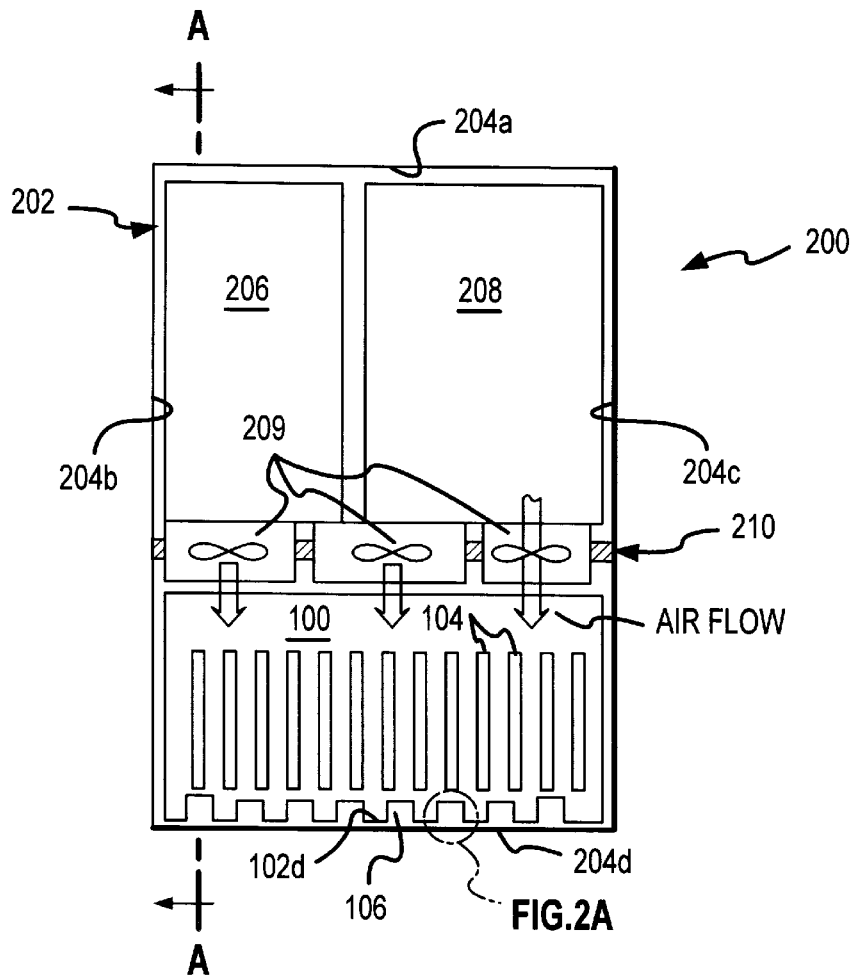
FIG. 2 is a top plan view of a computer system according to the present invention including one embodiment of the circuit board of FIG. 1.
Figure 2A:
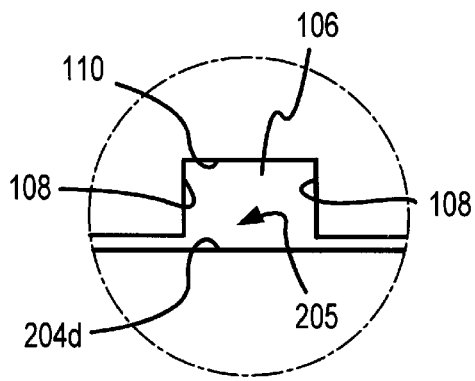
FIG. 2A is detailed view of portions of the computer system of FIG. 2.
Figure 3:
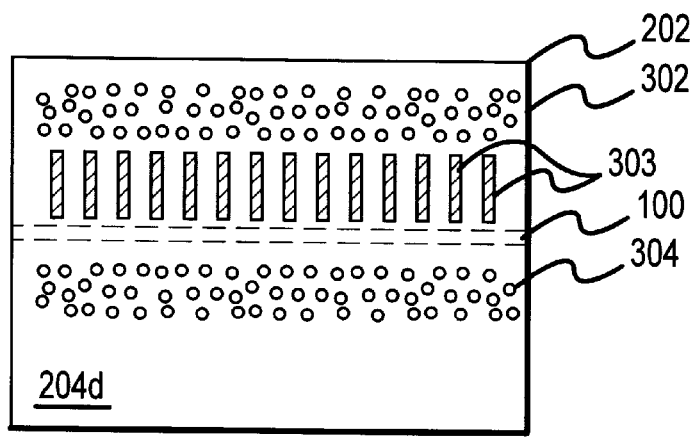
FIG. 3 is a rear plan view of one embodiment of the computer system of FIG. 2.
Figure 5:
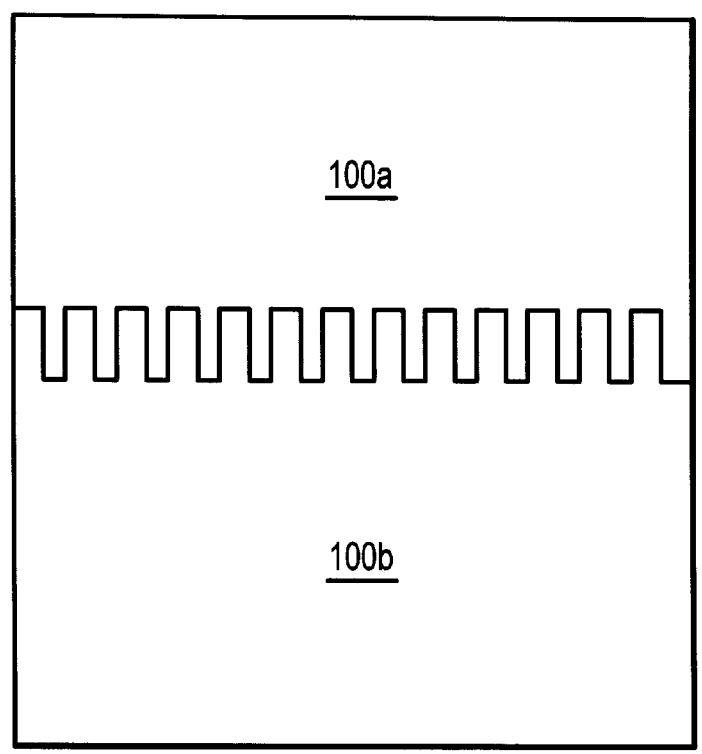
FIG. 5 is a top plan view depicting interleaving circuit board notches for efficient circuit board fabrication.

In an embodiment designed to minimize the area of circuit board 100 consumed by the notches 106 while still achieving the significant heat dissipation benefits of the present invention, notches 106 are included only in a rear side 102d of circuit board 100. One such embodiment of circuit board 100 is depicted in FIG. 2, which presents a top plan view of one embodiment of a computer system 200 according to the present invention. Turning briefly to FIG. 5, notches 106 in circuit board 100 may be arranged to facilitate efficient circuit board fabrication as shown. By interleaving notches 106 associated with a first circuit board 100a and notches 106 of a second circuit board 100b, both sets of notches can be fabricated without unnecessarily wasting circuit board raw material. Returning now to FIG. 2, the embodiment of computer system 200 depicted includes a substantially rectangular chassis 202 comprised of four sides or faces 204a, 204b, 204c and 204d Computer system 200 may suitably include one or more processor board(s) 206, memory board(s) 208, an I/O board designated in FIG. 2 as circuit board 100, and one or more AMD's 209 to assist in maintaining acceptable temperatures within chassis 200. In addition to those identified, a variety of other boards and components that will be familiar to those skilled in the design of computer systems may also be included in computer system 200. In embodiments designed for high end network servers and workstations, each of the boards or planars may be interconnected through an intermediate board 210. In other embodiments (not depicted) of computer system 200 such as desk top personal computers that are more suitable for consumer use and other lower end applications, circuit board 100 may connect directly to a motherboard that includes one or more central processing units and associated cache memories as well as circuitry and connections for the system memory modules. Circuit board 100 is suitably sized to be received within computer system 200 such that the rear side 102d of circuit board 100 abuts or is located proximal to an interior surface of rear face 204d of chassis 202. In this embodiment, the sidewalls 108 as shown in FIG. 2A, and baseline 110 of notch 106 together with the interior surface of rear face 204d define an air passage 205 when circuit board 100 is properly received within computer system 200 with rear side 102d of circuit board 100 abutting or proximal to rear face 204d of chassis 202. Referring to FIG. 3, a plan view of rear face 204d according to one embodiment of the present invention is depicted. In this embodiment, rear face 204d includes an upper exhaust port 302 and a lower exhaust port 304 vertically displaced on either side of circuit board 100 when circuit board 100 is received within chassis 202. It should be noted that slots 303 in rear face 204d do not provide a suitable passage for air flow because slots 303 are blocked either by a rear bulkhead of an I/O card or by a dummy blank. The inclusion of lower exhaust ports 304 below circuit board 100 coupled with notches 106 formed at the rear side edge of circuit board 100 combine to provide an effective means for dissipating heat by providing a low resistance air flow path in regions of computer system 200 that would otherwise be characterized by essentially stagnant air. More specifically, the invention introduces a low resistance air flow path that permits air to circulate in the vicinity of the abutment between circuit board and rear face 204d of chassis 202.

Figure 4:
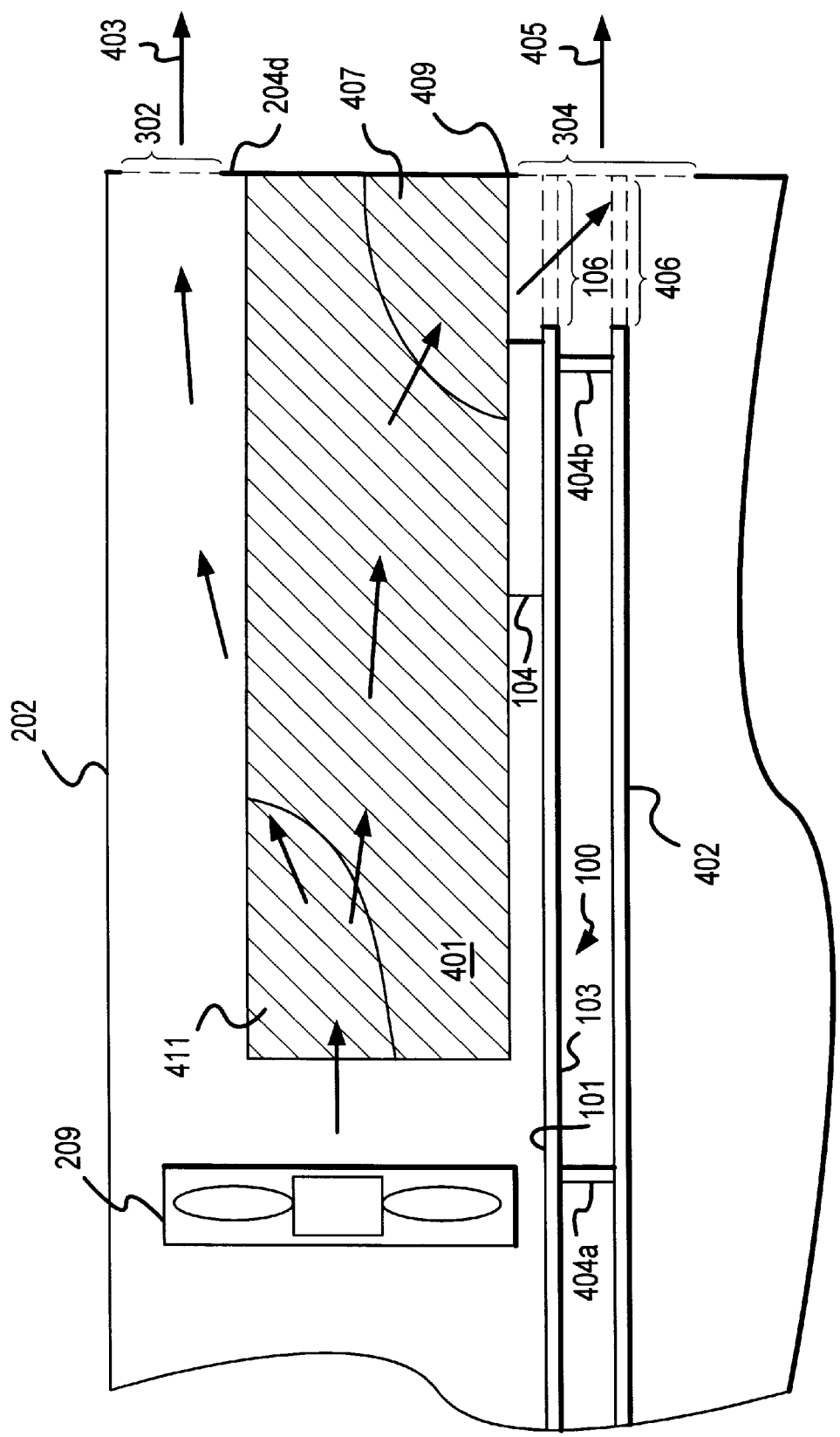
FIG. 4 is a cross sectional view taken along plane A—A of FIG. 2.

Turning to FIG. 4, the air flow and heat dissipation benefits achieved by the present invention are diagrammed. FIG. 4 comprises a cross sectional view of computer system 200 taken along plane A—A of FIG. 2 and depicts AMD 209 directing air flow at rear face 204d of chassis 202 over circuit board 100 and through upper exhaust port 302 and lower exhaust port 304 of rear face 204d. One of a plurality of I/O cards 401 is depicted as connected to circuit board 100 via a connector 104 attached to upper surface 101 of circuit board 100. In the depicted embodiment, circuit board 100 is attached to a sheet metal piece 402 via spacers 404a and 404b (generically or collectively referred to herein as spacer(s) 404 suitable for maintaining circuit board 100 substantially parallel to and displaced above sheet metal piece 402. In this manner, components (not shown) may be attached to lower surface 103 of circuit board 100. In addition to mechanical support, sheet metal piece 402 suitably provides a large conductive plane for shielding circuit board 100 and I/O cards 401 above sheet metal piece 402 and components and electronics below sheet metal piece 402 from one another. In one embodiment, for example, sheet metal piece 402 may separate circuit board 100 and I/O cards 401 from a system power supply (not depicted). In one embodiment, sheet metal piece 402 includes vents 406 that substantially align with the notches 106 and other air flow facilitating voids in circuit board 100. The sheet metal vents 406 may simply comprise voids or holes in sheet metal piece 402. In embodiments designed to maximize the EMF shielding effect mentioned previously, sheet metal vent 406 may comprise perforated sheet metal that forms a screen effective at both permitting air flow and shielding EMF interference. In embodiments employing sheet metal vents 406, as shown in FIG. 4, lower exhaust port 304 may suitably extend below the level of sheet metal piece 402 to further reduce the resistance of the air flow path within computer system 200 identified by reference numeral 405. In another embodiment (not depicted), the separation between sheet metal piece 402 and components located thereunder may be too small to permit significant air flow exhausting below sheet metal piece 402. In such embodiments, sheet metal piece 402 may lack notches or voids corresponding to notches 106 in circuit board 100 and the lower exhaust port 304 of rear face 204d might extend only to the level of sheet metal piece 402. To increase the volume of space below circuit board 100 in such an embodiment, the spacers 404 may be increased in length thereby increasing the displacement between circuit board 100 and sheet metal piece 402. This effectively redistributes the exhaust area from 403 only to both 403 and 405 and is accomplished without increasing the overall height of chassis 202.

The benefits provided by the present invention are seen in FIG. 4 by the dual air paths 403 and 405 by which forced air is exhausted from computer system 200. In the absence of lower exhaust port 304, air flow would quickly escape from between the narrow confines of the I/O cards and would be biased to upper portions of chassis 202 since this provides the lower path of resistance for air forced by AMD 209. As the functionality and performance of I/O card 401 increase and/or the card-to-card spacing between cards decreases, it becomes more important and more difficult to direct adequate air flow to all portions of the I/O cards 401. Air flow proximal to remote region 407 of I/O cards 401 will be significantly less than air flow in accessible region 411, where remote region 407 refers to the region of I/O card 401 proximal to the corner 409 formed by rear face 204d of chassis 202 and circuit board 100 and where accessible region 411 refers to the region of I/O card 401 distal from both circuit board 100 and rear face 204d. The addition of voids 106 in circuit board 100, particularly in the rear side 102d of circuit board 100, coupled with the presence of lower exhaust port 304 in rear face 204d create a low resistance air path designated by reference numeral 405 that flows through remote region 407 reducing the differential between air flow rate proximal to remote region 407 and air flow rate proximal to accessible regions 411 of I/O cards 401 thereby providing enhanced cooling of components in region 407. In addition, the presence of lower exhaust port 304 reduces the pressure differential within chassis 202 thereby resulting in an overall greater rate of air flow caused by AMD's 209.

Thus, the present invention contemplates a method of cooling circuit boards in a computer system that includes forcing air, by means of AMD 209 in the depicted embodiment, towards the rear face 204d of a computer chassis 202 over a circuit board 100 and a plurality of I/O cards 401 that are received within the circuit board 100. The forced air is then exhausted from the computer system through upper and lower exhaust ports vertically displaced on either side of circuit board 100 via notches 106 that that are formed in circuit board 100. In an embodiment in which computer system 200 includes a sheet metal piece 402 that includes vents 406 that are aligned with notches 106 of circuit board 100, the air forced from computer system 200 with the method of present invention is exhausted via the vents 406 in sheet metal piece 402 in addition to the notches 106 in computer system 100.

It will be apparent to those skilled in the art having the benefit of this disclosure that the present invention contemplates a system for enhanced cooling. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A computer system comprising:
   a chassis of substantially rectangular cross section, wherein a rear face of the chassis includes upper and lower exhaust ports;
   an expansion board comprised of an upper and lower surface and suitable for receiving a plurality of expansion cards via connectors attached to the upper surface, wherein the expansion board is housed within the chassis with a rear side of the expansion board proximal to an interior surface of the rear face of the chassis between the upper and lower exhaust ports, and wherein the expansion board includes at least one void for facilitating air flow; and
   an air moving device positioned within the chassis for directing air flow across the expansion board toward the rear face of the chassis and, via the at least one void in the expansion card, through the upper and lower exhaust ports.

2. The computer system of claim 1, wherein at least one of the plurality of voids comprises a notch formed in a perimeter of the expansion board, wherein the interior surface of the chassis together with the notched void cooperatively define a passage for facilitating air flow.

3. The computer system of claim 1, further comprising a plurality of expansion cards received by the expansion board via the connectors.

4. The computer system of claim 1, further comprising a sheet metal piece vertically displaced below and substantially parallel to the expansion board.

5. The computer system of claim 4, wherein the expansion board is connected to the sheet metal piece via spacers suitable for maintaining the expansion board displaced above the sheet metal piece.

6. The computer system of claim 4, wherein the sheet metal piece is vertically displaced below the lower exhaust port of the rear face of the chassis.

7. The computer system of claim 4, wherein the sheet metal piece is vertically displaced above a portion of the lower exhaust port, and further wherein the sheet metal piece includes at least one vent corresponding to the at least one void in the expansion board.

8. The computer system of claim 7, wherein each of the at least one vents in the sheet metal piece comprises a perforated portion of the sheet metal piece.

9. The computer system of claim 4, wherein the sheet metal piece is displaced between the expansion card and system electronics thereby shielding the expansion card and the system electronics from one another.

10. The method of cooling expansion cards in a computer comprising directing air flow across an expansion board of the computer system to which the expansion cards are connected, through a plurality of voids included in the expansion board and from the computer system via exhaust ports vertically displaced on either side of the expansion board in a rear face of a chassis of the computer system wherein air flow velocity proximal to a remote region of the cards approximates air flow velocity proximal to accessible regions of the cards, wherein directing air flow through the plurality of voids comprises directing air flow through passages defined by an interior surface of the chassis together with a plurality of notches at the perimeter of the expansion board.

11. The method of claim 10, further including directing the air flow through a plurality of voids in a sheet metal piece to which the expansion board is attached via spacer structures.

12. The method of claim 11, wherein the plurality of voids in the sheet metal piece are substantially aligned with the plurality of voids in the expansion board.

* * * * *